United States Patent [19]
Fukuda et al.

[11] Patent Number: 5,539,569
[45] Date of Patent: Jul. 23, 1996

[54] OPTOELECTRIC ARTICLES AND A PROCESS FOR PRODUCING THE SAME

[75] Inventors: Tsuguo Fukuda, Sendai; Tatsuo Kawaguchi; Minoru Imaeda, both of Nagoya, all of Japan

[73] Assignee: NGK Insulators, Ltd., Japan

[21] Appl. No.: 411,413

[22] Filed: Mar. 27, 1995

[30] Foreign Application Priority Data

Mar. 25, 1994 [JP] Japan .................................. 6-055611
Sep. 16, 1994 [JP] Japan .................................. 6-222082

[51] Int. Cl.⁶ .............................. G02F 1/00; G02B 6/10
[52] U.S. Cl. .......................... 359/322; 385/130; 385/131; 117/3; 117/60; 437/120; 437/121
[58] Field of Search .................................. 359/322, 321, 359/315; 385/130, 131, 141; 117/3, 4, 60, 918; 437/120, 121, 124, 119, 164

[56] References Cited

U.S. PATENT DOCUMENTS

| 4,088,514 | 5/1978 | Hara et al. ................................ | 117/3 |
| 4,642,142 | 2/1987 | Harman ..................................... | 427/120 |
| 4,766,954 | 8/1988 | Bierlein et al. .......................... | 427/164 |
| 5,039,187 | 8/1991 | Ballman et al. ......................... | 385/130 |

FOREIGN PATENT DOCUMENTS

| 0444209 | 9/1991 | European Pat. Off. . |
| 0515682 | 12/1992 | European Pat. Off. . |

OTHER PUBLICATIONS

Patent Abstracts of Japan, vol. 13, No. 61 (C–567). Oct. 20, 1988.

Applied Phys. Letters, vol. 26, No. 9, 1 May 1975, "Liquid–Phase–Epitaxial Growth of Single Crystal LiNbO3 Thin Film", Kondo et al., pp. 489–491.

Journal of Crystal Growth, "Liquid Phase Epitaxial Growth of LiNbO3 Thin Film Using Li2O–B2O3 Flux System", Yamada et al., pp. 48–60.

Journal of Appl. Phys., vol. 46, No. 5, May 1975, "Optical Waveguiding in LiNbO3 Single–Crystal Film Grown by the EGM Technique", Miyazawa et al., pp. 2223–2228.

Journ. of Crystal Growth, "Direct Measurement of Temperature Dependence of Lattice Mismatches Between LPE––Grown Li(Nb,Ta)O3 Film and LiTaO3 Substrate", Sugh et al. pp. 607–614.

Miyazawa, Shintaro et al., "Optical Waveguide of $LiNbO_3$ Thin Film Grown by Liquid Phase Epitaxy", Applied Physics Letters, vol. 26, No. 1, pp. 8–10, Jan. 1, 1975.

Baudrant, A. et al., "Liquid Phase Epitaxy of $LiNbO_3$ Thin Films for Integrated Optics", Mat. Res. Bull. vol. 10, pp. 1373–1377, Pergamon Press, USA, 1975.

Tamada, Hitoshi et al., "$LiNbO_3$ Thin–Film Optical Waveguide Grown by Liquid Phase Epitaxy and its Application to Second Harmonic Generation", J. Appl. Phys. 70, pp. 2536–2541 Sep. 1, 1991.

Yamada, Atsuo et al. "Liquid Phase Epitaxial Growth of $LiNbO_3$ Thin Film Using $Li_2O$–$B_2O_3$ Flux System", Journal of Crystal Growth 132, pp. 48–60, Elsevier Science Publishers, North–Holland, 1993.

*Primary Examiner*—Loha Ben
*Attorney, Agent, or Firm*—Parkhurst, Wendel & Burr

[57] ABSTRACT

According to the invention, a film of optoelectric single crystal may be formed on a substrate made of optoelectric single crystal by a liquid phase epitaxial process. The process comprises the steps of producing a melt of a solute and a melting medium, a solid phase and a liquid phase coexisting in the melt; then cooling the liquid phase for producing super cooling state in the liquid phase; and contacting the substrate to the liquid phase to form the film on the substrate by an epitaxial growing process. The film may be produced on the substrate, the film having a half value width of an X-ray rocking curve not more than that of the substrate.

14 Claims, 5 Drawing Sheets

FIG_2
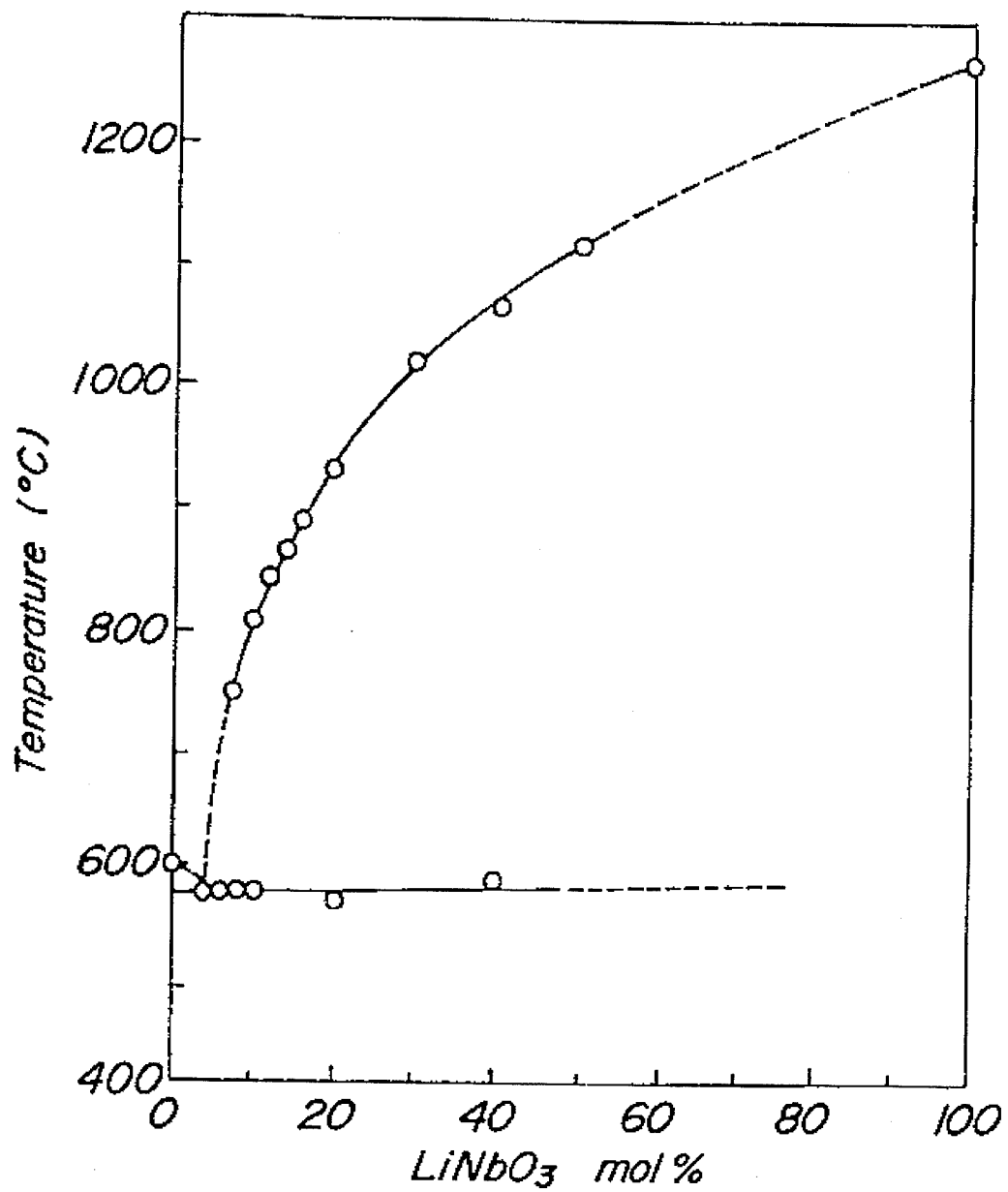

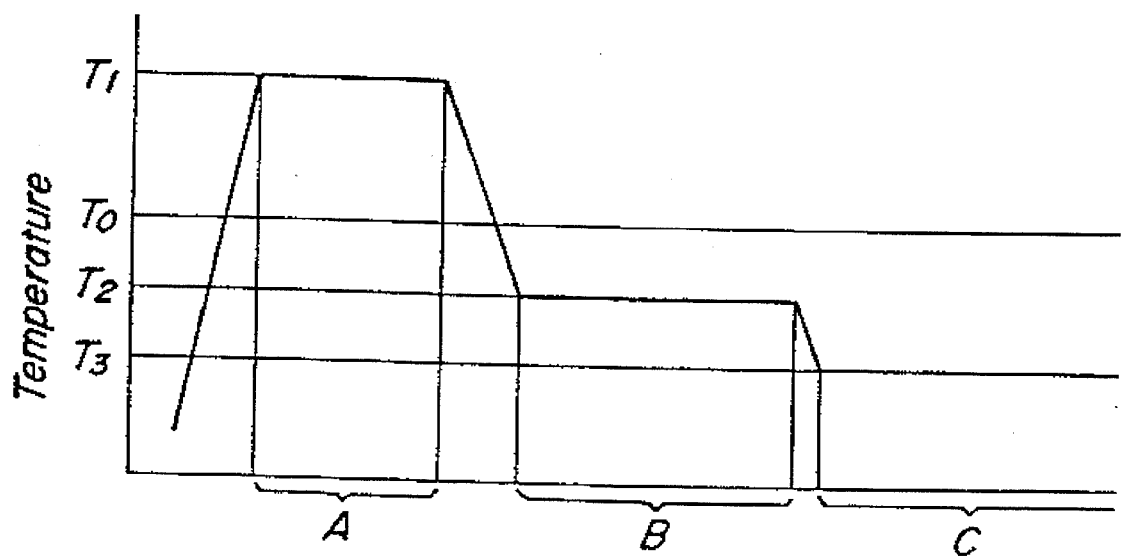
FIG_3

FIG_4a
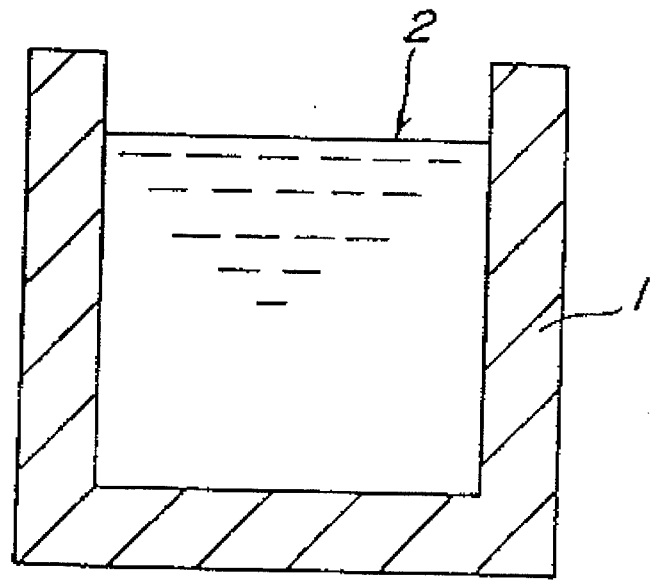
FIG_4b
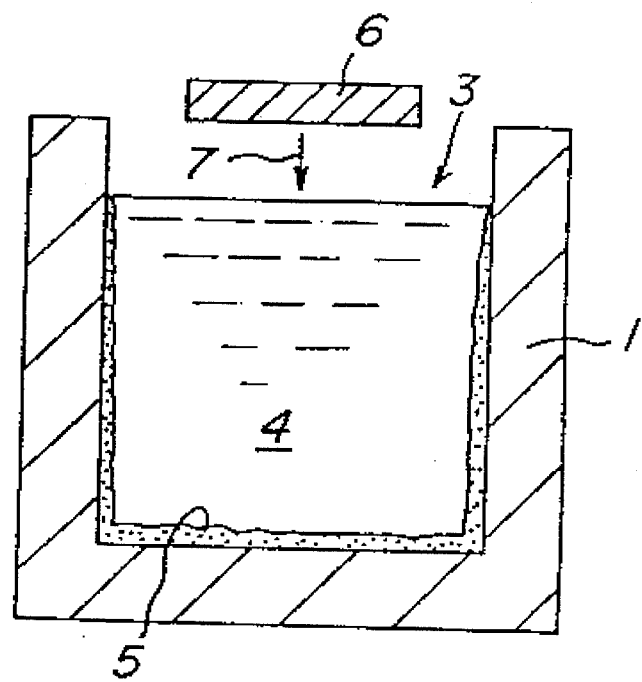

OPTOELECTRIC ARTICLES AND A PROCESS FOR PRODUCING THE SAME

BACKGROUND OF THE INVENTION

1. Field of the Invention

The present invention relates to optoelectric articles and a process for producing the same.

2. Related Art Statement

Lithium niobate ($LiNbO_3$) single crystal and lithium tantalate ($LiTaO_3$) single crystal have been expected as materials for optoelectronics. It is known that a thin film of the lithium niobate single crystal is formed on a substrate made of the lithium niobate single crystal or the like by so-called liquid phase epitaxial process. For example, according to the description in "Appl. Phys. Letters", Vol. 26, No. 1 (1975), pp 8–10, a thin film of the lithium niobate single crystal is formed on a substrate of the lithium tantalate single crystal by the liquid phase epitaxial process. According to the description in "Mat. Res. Bull.", Vol. 10 (1975), pp 1373–1377, a thin film of the lithium niobate single crystal is formed on a substrate of the lithium niobate single crystal by the liquid phase epitaxial process. According to the description in "J. Appl. Phys.", Vol. 70, No. 5 (1991), pp 2536–2541, a thin film of the lithium niobate single crystal is formed on a substrate of lithium niobate single crystal doped with magnesium oxide by the liquid phase epitaxial process.

The film-forming method in the liquid phase epitaxial process will be explained. FIG. 1 is a graph schematically illustrating a temperature schedule for a melt in case of the liquid phase epitaxial process. FIG. 2 is a graph showing a solubility curve of a pseudo-binary system such as $LiNbO_3$-$LiVO_3$. First, lithium niobate (a solute) and $LiVO_3$ (a melting medium) are charged and mixed together. A saturation temperature corresponding to a melt having a charged composition is taken as "$T_0$". While a temperature of the melt is held at $T_1$ higher than the saturation temperature $T_0$, lithium niobate and $LiVO_3$ are uniformly melted. In FIG. 1, "A" corresponds to this molten state. Then, the melt is cooled to a supercooled state by lowering the temperature of the melt to a temperature $T_4$ lower than the saturation temperature $T_0$. In FIG. 1, "C" corresponds to this supercooled state. A substrate is contacted with the supercooled melt.

The crystallinity of such single crystal may be evaluated by the half-value width of the X-ray rocking curve. For example, according to the description in "J. Cryst. Growth" 132 (1993) page 48–60, a substrate made of a lithium niobate single crystal doped with magnesium oxide is used to produce a thin film of a lithium niobate single crystal having a half value width comparable to that of the substrate.

SUMMARY OF THE INVENTION

The present inventors made intensive studies on the liquid phase epitaxial process and failed to produce a single crystal film having excellent properties and crystallinity on substrate with a high reproducibility. An explanation will be given below. First, so-called "pull-up process (Czochralski process: CZ process)" have been also known as a process for producing single crystal. However, when applying such process, a growing temperature necessary to form a film of the single crystal is generally too high to produce the single crystal having excellent crystallinity with high reproducibility. On the contrary, when applying the liquid phase epitaxial process, the single crystal film may be produced at a temperature lower than the growing temperature in the "pull-up" process. Such condition generally provides the single crystal film of excellent crystallinity.

However, as can be seen from FIG. 2, as the concentration of $LiNbO_3$ (a solute) increases, the saturation temperature increases and approaches the growing temperature in the pull-up process. Therefore, in order to form the film having excellent crystallinity, it is necessary to form the film at as low a temperature as possible. From this point of view, it is preferable to form the film at a temperature not more than 1000° C.

On the other hand, if the concentration of $LiNbO_3$ decreases and particularly if the saturation temperature becomes not more than $1000°$ C., the slope of the liquid phase line in FIG. 2 becomes very great. Therefore, even if the concentration of the solute in the melt slightly changes, the saturation temperature largely varies. In the liquid phase epitaxial process, the melt is kept at a temperature not less than the saturation temperature, and the film is formed in the supercooled state in which the film-forming temperature is lowered down than the saturation temperature. The crystallinity of the film is determined by the above supercooled state, and this supercooled state is determined by the saturation temperature and the film-forming temperature. Therefore, if the concentration of the solute in the melt slightly changes during the above process, it becomes impossible to form the film having excellent crystallinity with reasonable reproducibility. Particularly, a film-forming process is repeated during actual film-forming process and the composition of the melt changes with high response. Consequently, it is difficult to keep the concentration of the solute constant. Therefore, it is difficult to form films with high reproducibility.

In particular, the reproducibility becomes poor with deteriorated crystallinity, contrary to what would be expected, in a film-forming range of not more than 1000° C. in which the single crystal film having excellent crystallinity must be inherently formed.

Moreover, substrates made of lithium niobate single crystal are now produced by the pull-up process. However, according to this process, when forming a single crystal film on the single crystal substrate, it is difficult to form the film having better crystallinity than that of the single crystal substrate. Consequently, if an optical waveguide, a SHG (second harmonic generation) device, and so on are formed in the thus formed single crystal film, an optical damage resistivity of the optical waveguide becomes poor, and an energy threshold level of light which can be transmitted through the optical waveguide is low. Therefore, the substrate produced by the pull-up process is mechanically worked to obtain optical waveguide substrates, and thus the single crystal film produced by the liquid phase epitaxial process is not used effectively for the articles mentioned above. This problem is expected to be solved.

It is an object of the invention to improve an optical damage resistivity of an optical waveguide to a value sufficiently high for use as optoelectric devices, when such optical waveguide is formed in a film of an optoelectric single crystal which is formed on a substrate of an optoelectric single crystal by liquid phase epitaxial process.

It is another object of the invention to effectively utilize an optoelectric article having the above film and substrate as a material for various optoelectric devices such as an optical waveguide substrate, at SHG device etc.

It is another object of the invention to produce a single crystal film having excellent crystallinity, especially having better crystallinity than that of the substrate, with high reproductivity, when the film is formed on the substrate by the liquid phase epitaxial process.

The invention provides an optoelectric article comprising a substrate made of optoelectric single crystal and a film made of optoelectric single crystal formed on the substrate by a liquid phase epitaxial process, wherein an half value width of an X-ray rocking curve of the film is not more than that of the substrate.

The invention further provides a process for producing an optoelectric article comprising a substrate made of optoelectric single crystal and a film of optoelectric single crystal formed on said substrate by a liquid phase epitaxial process: said process comprising the steps of producing a melt of a solute and a melting medium, a solid phase and a liquid phase coexisting in said melt; then cooling the liquid phase for producing super cooling state in the liquid phase; and contacting the substrate to the liquid phase to form the film on the substrate by an epitaxial growing process.

These and other objects, features and advantages of the invention will be appreciated upon reading the following description of the invention when taken in conjunction with the attached drawings, with the understanding that some modifications, variations and changes of the same could be made by the skilled person in the art.

BRIEF DESCRIPTION OF THE DRAWINGS

For a better understanding of the invention, reference is made to the attached drawings, wherein:

FIG. 2 is a graph schematically showing the solubility curve of an $LiNbO_3$-$LiVO_3$ pseudo-binary system;

FIG. 3 is a graph schematically showing the temperature schedule of the melt according to the present invention so as to finely control the film-forming temperature over the wide temperature range;

FIGS. 4(a) and 4(b) are sectional views schematically illustrating the state of the melt in the crucible 1.

DETAILED DESCRIPTION OF THE INVENTION

In order to solve such difficulties in investigation, the inventors first examined the sequences of the liquid phase epitaxial process again. The supercooled state has been conventionally realized by fully melting the solute and the melting medium at a sufficiently high temperature of 1000°–1300° C., and setting the temperature of the melt at lower than the saturation temperature corresponding to the charged composition. That is, it was common knowledge that it was necessary to attain the supercooled state from the liquid phase at a sufficiently high temperature.

Figure 1:
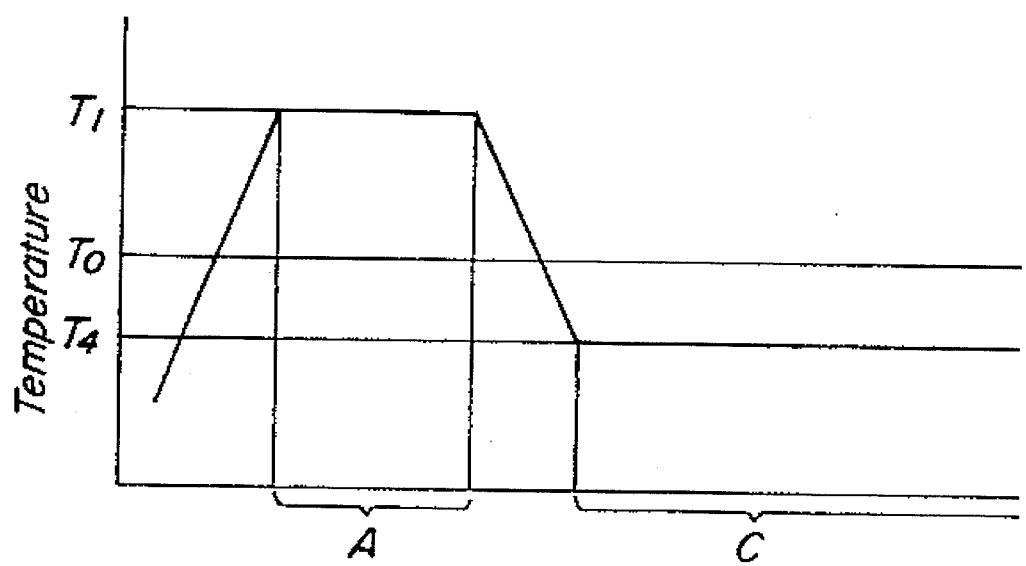
FIG. 1 is a graph schematically showing the temperature schedule of the melt in the liquid phase epitaxial process.
Figure 5:
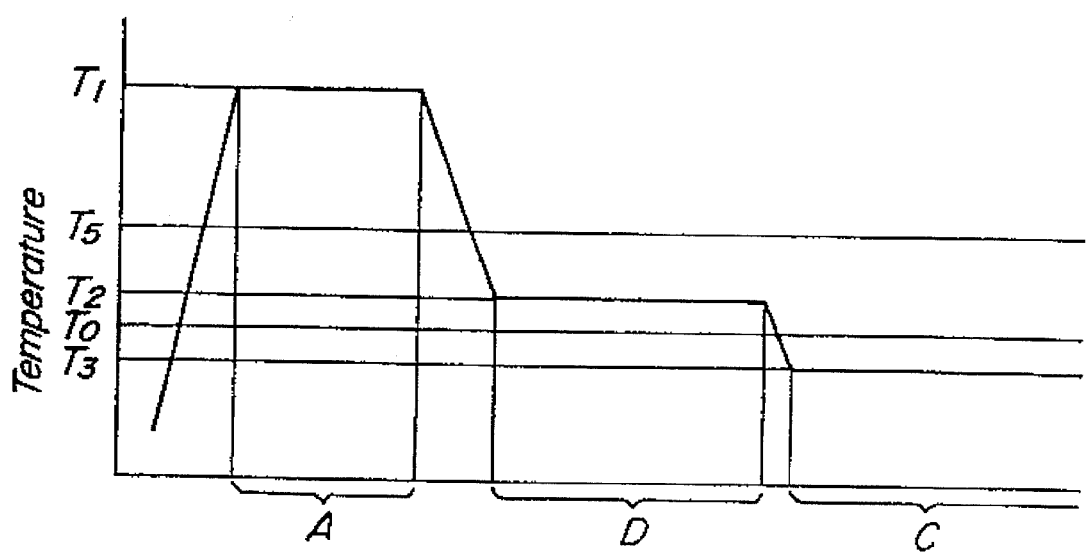
FIG. 5 is a graph schematically showing the other temperature schedule of the melt according to the present invention so as to finely control the film-forming temperature over the wide temperature range.

Having noted this point, the present inventors developed a process essentially different from the conventional ones. Such process will be explained referring to FIGS. 3 to 5. FIG. 3 and FIG. 5 are graphs schematically showing the temperature schedules of the melts in the liquid phase epitaxial process according to the present invention, respectively. FIGS. 4(a) and 4(b) schematically show the state of the melt in a crucible 1.

First, a solute and a melting medium are charged and mixed in the crucible 1. The saturation temperature $T_0$ of the melt is one-to-one determined by the concentration of the solute in the melt, that is, corresponding to the charged composition. This saturation temperature can be calculated, for example, from a liquid phase curve as shown in FIG. 2.

Then, while the temperature of the melt is kept at $T_1$ higher than the saturation temperature $T_0$, the solute and the melting medium are uniformly melted. In FIG. 3, "A" corresponds to the molten state. As shown in FIG. 4(a), the mixture is entirely in the form of a liquid phase.

Next, the temperature of the melt is lowered to a solid phase-precipitating temperature $T_2$ lower than the saturation temperature $T_0$. In this state, the melt is first kept in an supercooled state. When the melt is kept at that temperature $T_2$ for a sufficiently long time, a solid phase comes out from the melt. In FIG. 3, "B" corresponds to a state in which the melt is kept for the precipitation of the solid phase. As shown in FIG. 4(b), at that time, the melt 3 is separated into a liquid phase 4 and a solid phase 5. The solid phase 5 precipitates along the inner surface of the crucible 1.

Thereafter, the temperature of the melt is lowered to convert the liquid phase 4 to the supercooled state. In FIG. 3, "C" corresponds to this supercooled state. The substrate 6 is lowered toward the surface of the liquid phase 4 in the supercooled state as shown by an arrow 7, and contacted with the liquid phase 4, thereby epitaxially growing a film of single crystal on the substrate.

The present inventors further found the following process. As shown in FIG. 5, the temperature of the melt is kept at $T_1$ higher than the saturation temperature $T_0$ and the solute and the melting medium are uniformly melted. In FIG. 5, "A" corresponds to the molten state. Next, the temperature of the melt is lowered to a temperature $T_2$ higher than the saturation temperature $T_0$ and kept at the temperature $T_2$. A solid phase does not come out from the melt at the temperature $T_2$. Then, a predetermined amount of the solute is added into the melt and the saturation temperature of the melt is increased from $T_0$ to a temperature $T_5$ higher than $T_2$. Therefore, the melt is kept in a supercooled state after adding the solute. When the melt is kept at that temperature $T_2$ for a sufficiently long time, a solid phase comes out from the melt and the liquid phase is stabilized. In FIG. 5, "D" corresponds to this state in which the melt is kept for the precipitation of the solid phase and the liquid phase and the solid phase coexist.

Thereafter, the temperature of the melt is lowered to a temperature $T_3$ to convert the liquid phase 4 to the supercooled state. In FIG. 5, "C" corresponds to this supercooled state. The substrate 6 is lowered toward the surface of the liquid phase 4 in the supercooled state as shown by an arrow 7, and contacted with the liquid phase 4, thereby epitaxially growing a film of single crystal on the substrate.

In the above processes, in order to convert the liquid phase of the melt to the supercooled state, a substrate cooled to a temperature $T_3$ lower than the temperature $T_2$ may be contacted to the melt kept at the temperature $T_2$. The melt near the surface of the cooled substrate is thereby cooled and converted to the supercooled state, basically same as the case that the melt itself is cooled to the temperature $T_2$, and thus a film may be formed on the surface of the substrate.

In this way, according to the processes of the present invention, the state "B" or "D" in which the solid phase and the liquid phase stably co-exist is taken as a starting point. That is, the temperature $T_2$ is taken as a starting point, and the liquid phase is converted to the supercooled state by lowering the temperature in the state "B" or "D" to the temperature $T_3$. In this way, in the state in which the solid phase and the liquid phase co-exist, the concentration of the solute in the liquid phase is kept at the saturated concentration at the holding temperature $T_2$ so long as the holding temperature does not exceed the saturated temperature of the whole system.

For example, if the concentration of the solute in the melt decreases, the amount of the solid phase decreases at the holding temperature $T_2$, corresponding to this decreased concentration. On the other hand, if the concentration of the solute increases, the solid phase increases corresponding to the increased concentration of the solute. Therefore, the relationship between the temperature of the liquid phase and the concentration of the solute may be always kept constant. Since the film-forming temperature $T_3$ is as a matter of course kept constant, the difference between $T_2$ and $T_3$ (a degree of supercooling) is kept constant. Consequently, the supercooled state may be accurately controlled.

As a result, even if the composition of the melt changes due to repeated formation of the films onto the substrates during the actual film-forming process, the supercooled state can be almost completely kept constant. Therefore, the film of the single crystal having excellent crystallinity can be produced with high reproducibility.

According to the process of the present invention, the film of the single crystal having predetermined quality may be produced with high reproducibility. In addition, the crystallinity of the single crystal may be considerably improved. In particular, according to the process of the present invention, when applying the condition described below, the present inventors successfully produced the film of the lithium niobate single crystal having a half-value width of an X-ray rocking curve smaller than that of the single crystal substrate. Such film have not been produced in the art.

A reason for such considerable effects is not clear. However, the following explanation may be submitted. According to the conventional process, the solute is uniformly molten in the melting medium to form a uniform liquid phase when a substrate is contacted to the melt. Therefore, the appearance of the solid phase occurs at the first time in the whole liquid phase on the surface of the substrate, at the moment that the substrate contacts the melt. Therefore, it is thought that a relatively large nucleation energy is needed to start the growing of the single crystal film. In other words, a relatively large nucleation energy is needed to start the growing of the film at the interface between the substrate and the film. Such large nucleation energy may cause disorder in the atomic order at the interface and consequently the crystallinity of the epitaxial film sequentially coming out on the atomic order at the interface may be influenced by the disorder and degraded.

On the other hand, according to the invention, as shown in FIG. 4(b), the solid phase 5 preliminarily coexists in the melt 3 before the substrate 6 contacts the melt 3. In this state, melting and precipitation simultaneously occur at the interface between the solid phase 5 and the liquid phase 4 as viewed microscopically. Therefore, when a fresh substrate 6 is contacted with the melt 3, a film begins to be smoothly grown to produce a single crystal film having excellent crystallinity.

The present inventors adopted the above process, successfully produced films having half-values of X-ray rocking curves smaller than those of single crystal substrates, then produced an optical waveguide in each film of the single crystal and evaluated optical properties of each optical waveguide. As a result, the inventors found and confirmed that optical damage resistivity of each optical waveguide was conspicuously improved. Consequently, the optoelectric articles of the invention may be utilized widely as various optoelectric devices.

Now, the half-value width of the X-ray rocking curve will be explained. The crystallinity of the single crystal substrate and the single crystal film can be evaluated by their half-value widths of the X-ray rocking curves. In general, it can be considered that the smaller the half-value width, the more excellent the crystallinity of the single crystal. Since this value itself varies depending upon a standard crystal etc. used in an X-ray measuring apparatus, an absolute value cannot be identified.

However, the crystallinity of the single crystal thin film produced by the liquid phase epitaxial process is strongly influenced by that of the single crystal substrate. Therefore, whether the crystallinity of the single crystal film produced is excellent or not must be judged with reference to the half value width of the X-ray rocking curve of the substrate used. Particularly, since single crystal substrates of optical grade are produced at present by the pull-up process, it is preferable that the half value width of the X-ray rocking curve of the single crystal film is smaller than that of the optical grade single crystal substrate.

PREFERRED EMBODIMENTS OF THE INVENTION

The substrate and the film may be made of the same kind of single crystal or different kinds of single crystal. However, if the substrate and the film are made of the different kinds of single crystals, it is necessary to adjust the lattice constants of the different kinds of single crystal. Such optoelectric single crystals may preferably be one or more kinds of single crystal selected from single crystal of lithium niobate ($LiNbO_3$), single crystal of lithium tantalate ($LiTaO_3$) and single crystal of $LiNb_xTa_{1-x}O_3$: $0<x<1$).

Heretofore, the optoelectric single crystal substrate is formed by the pull-up process, and a substrate of lithium niobate single crystal with excellent crystallinity (the optical grade) can be obtained. However, up to now, a substrate of lithium tantalate single crystal produced by the pull-up process has crystallinity inferior to that of the substrate of the lithium niobate single crystal of optical grade. Therefore, if a single crystal film is formed on the substrate of the lithium tantalate single crystal having relatively poor crystallinity, it is difficult to form a single crystal film having more excellent crystallinity than that of the single crystal film formed on the substrate of lithium niobate single crystal of the optical grade.

Due to the above reason, it is preferred to use the substrate of the lithium niobate single crystal of the optical grade. However, this problem occurs only because of the conventional technique of the pull-up process. Therefore, if the substrate of lithium tantalate single crystal of the optical grade, which has crystallinity substantially comparable to that of the substrate of lithium niobate single crystal, is obtained in the future, such substrate of lithium tantalate single crystal may be preferably used.

When the solute is one or more solutes selected from a group of lithium niobate, lithium tantalate and $LiNb_xTa_{1-x}O_3$, it is preferred to use one or more melting media selected from a group of $LiVO_3$ and $LiBO_2$. If a combination of the solute and the melting medium mentioned above is selected, the charged composition of the melt may preferably be a composition comprising 10 mol %/90 mol % to 60 mol %/40 mol % of the solute/the melting medium.

If the ratio of the solute is less than 10 mol %, as shown in FIG. 2, the slope of the liquid phase curve becomes so great in a phase diagram of a pseudo-binary component system of solute-melting medium that the concentration of the melt largely changes owing to the growth of the film. Accordingly, it becomes difficult to stably keep the film-forming condition. If the ratio of the solute is more than 60%, the saturation temperature increases. Accordingly, the film-forming temperature becomes too high, and it becomes difficult to produce the single crystal film having excellent crystallinity.

In this embodiment, the charged composition of the melt may preferably be a composition comprising 10 mol %/90 mol % to 50 mol %/50 mol % of the solute/the melting medium and the film forming temperature may preferably be 950° C. to 700° C. The half value width of the X-ray rocking curve of the single crystal film may be made smaller than that of the single crystal substrate by applying the film forming condition (the charged composition and the film forming temperature) as described above.

Generally, a degree of supercooling (a difference between the film forming temperature and the holding temperature at which the liquid phase and the solid phase coexist) may preferably be not more than 50° C. to reduce the half value width of the single crystal film. When the substrate and the film are made of lithium niobate single crystal, the degree of supercooling may preferably be not more than 20° C., more preferably be not more than 15° C., and most preferably be not more than 10° C. Moreover, a lower limit of the degree of supercooling is theoretically 0° C. However, the degree of supercooling may preferably be not less than 0° C. to stably produce the film.

EXPERIMENTS

In the following, specific experimental results will be described.

EXPERIMENT 1

In an $LiNbO_3$-$LiVO_3$ pseudo-binary system, a charged composition of a melt was set at a composition selected from 10 mol % of $LiNbO_3$ and 90 mol % of $LiVO_3$ to 60 mol % of $LiNbO_3$ and 40 mol % of $LiVO_3$. The process according to the invention was effected along the temperature schedule in FIG. 3. A ratio of $LiNbO_3$ in each melt was shown in Table 1. Each melt 2 was stirred at a sufficiently high temperature $T_1$ (1000° C.–1300° C.) for not less than 3 hours to attain a sufficiently uniform liquid state.

Thereafter, after the melt was cooled to the holding temperature $T_2$, the melt was held at this temperature for not less than 12 hours until nuclei of lithium niobate corresponding to an oversaturated amount were formed and the solid phase 5 precipitated. The liquid phase 4 in the melt was in the saturated state at the temperature $T_2$, and the liquid phase 4 and the solid phase 5 of lithium niobate coexisted in the melt 3. Then, the melt 3 was cooled from $T_2$ to the film-forming temperature $T_3$ lower than $T_2$ by a degree of supercooling $\Delta T$. Immediately after that, a substrate 6 of lithium niobate single crystal was contacted with the melt to produce a film.

Table 1 shows a relationship of half value widths of X-ray rocking curves of the lithium niobate single crystal films, the film forming temperatures and the charged compositions of the melts, when the degree of supercooling $\Delta T$ ($T_2 - T_3$)=5° C. In the Table 1, "x" means that the film was not able to be produced. Table 2 shows a relationship of half value widths of X-ray rocking curves of the lithium niobate single crystal films, the film forming temperatures and the charged compositions of the melts, when the degree of supercooling $\Delta T$=10° C.

The half-value widths were measured with use of reflection at a (0012) face according to a double-crystal method. A CuKα1 ray was used as an incident X-ray, and a (422) face of GaAs single crystal was used as a monochrometer. The half-value width of the substrate itself was measured prior to producing the film thereon and the value of the half value width of each substrate was compared with that of the single crystal film produced as described above.

A half-value width of the X-ray rocking curve of each of the single crystal substrates of lithium niobate of the optical grade used by the inventor was 6.8 to 6.9 (arc sec), and these values were taken as standards for evaluating crystallinity of the film of lithium niobate single crystal.

TABLE 1

A degree of supercooling $\Delta T$ = 5° C.
A charged composition of each melt
x mol % $LiNbO_3$—(100 − x) mol % $LiVO_3$

| A film-forming temperature °C. | x | | | | | |
|---|---|---|---|---|---|---|
| | 10 | 20 | 30 | 40 | 50 | 60 |
| 600 | X | X | X | X | X | X |
| 650 | 8.6 | 7.8 | 7.9 | 8.2 | 10.2 | 16.0 |
| 700 | 5.8 | 5.8 | 5.9 | 5.9 | 6.5 | 12.1 |
| 750 | 5.7 | 5.7 | 5.7 | 5.8 | 6.0 | 7.8 |
| 800 | 5.8 | 5.7 | 5.6 | 5.7 | 5.9 | 7.6 |
| 850 | 6.7 | 5.6 | 5.7 | 5.8 | 5.9 | 7.3 |
| 900 | X | 5.6 | 5.6 | 5.8 | 5.9 | 7.3 |
| 950 | X | 6.9 | 6.0 | 6.1 | 6.4 | 8.0 |
| 1000 | X | X | 7.8 | 8.0 | 8.1 | 8.3 |
| 1050 | X | X | X | 10.1 | 11.3 | 11.4 |
| 1100 | X | X | X | X | 15.0 | 15.5 |
| 1150 | X | X | X | X | X | X |

TABLE 2

A degree of supercooling $\Delta T$ = 10° C.
A charged composition of each melt
x mol % $LiNbO_3$—(100 − x) mol % $LiVO_3$

| A film-forming temperature °C. | x | | | | | |
|---|---|---|---|---|---|---|
| | 10 | 20 | 30 | 40 | 50 | 60 |
| 600 | X | X | X | X | X | X |
| 650 | 8.5 | 7.9 | 8.1 | 8.3 | 12.2 | 20.7 |
| 700 | 5.9 | 5.9 | 5.8 | 5.9 | 8.7 | 16.8 |
| 750 | 5.7 | 5.7 | 5.7 | 5.7 | 7.1 | 10.2 |
| 800 | 5.8 | 5.7 | 5.7 | 5.7 | 6.1 | 8.6 |
| 850 | 10.2 | 5.6 | 5.7 | 5.8 | 5.9 | 7.3 |
| 900 | X | 5.6 | 5.6 | 5.8 | 6.0 | 7.8 |
| 950 | X | 12.6 | 6.0 | 6.1 | 6.8 | 9.0 |
| 1000 | X | X | 11.5 | 10.4 | 10.3 | 10.7 |
| 1050 | X | X | X | 16.1 | 11.3 | 11.4 |
| 1100 | X | X | X | X | 20.4 | 19.1 |
| 1150 | X | X | X | X | X | X |

COMPARABLE EXPERIMENT 1

Films of lithium niobate single crystal were produced according to the conventional liquid phase epitaxial process. Each melt was stirred at a temperature (1000° C.–1300° C.) sufficiently higher than its saturation temperature for not less than 3 hours to attain sufficiently uniform liquid state.

Thereafter, the melt was cooled to a temperature lower than the saturation temperature by 60° C./hour. Immediately after that, a substrate of lithium niobate single crystal was contacted with the melt to produce a film. A half-value width of an X-ray rocking curve of each of the single crystal substrates of lithium niobate used by the inventor was 6.8 to 6.9 (arc sec) which were same as described above. Table 3 shows a relationship of half value widths of X-ray rocking curves of the lithium niobate single crystal films, the film forming temperatures and the charged compositions of the melts.

TABLE 3

| A film-forming temperature °C. | A charged composition of each melt x mol % LiNbO$_3$—(100 − x) mol % LiVO$_3$ | | | | | |
|---|---|---|---|---|---|---|
| | x | | | | | |
| | 10 | 20 | 30 | 40 | 50 | 60 |
| 820 | X | | | | | |
| 840 | 13.4 | | | | | |
| 850 | 10.2 | | | | | |
| 855 | 8.4 | | | | | |
| 860 | X | | | | | |
| 920 | | X | | | | |
| 945 | | 15.1 | | | | |
| 950 | | 10.6 | | | | |
| 955 | | 8.2 | | | | |
| 960 | | X | | | | |
| 990 | | | X | | | |
| 1015 | | | 20.0 | | | |
| 1020 | | | 12.3 | | | |
| 1025 | | | 9.1 | | | |
| 1030 | | | X | X | | |
| 1060 | | | | 24.1 | | |
| 1065 | | | | 10.8 | | |
| 1070 | | | | X | X | |
| 1095 | | | | | 26.4 | |
| 1100 | | | | | 20.4 | |
| 1105 | | | | | X | X |
| 1140 | | | | | | 28.1 |
| 1145 | | | | | | 20.5 |
| 1150 | | | | | | X |

As can be seen from the results shown in the Tables 1, 2 and 3, the films may be produced only within an extremely narrow temperature range in the comparable experiment (Table 3). That is, when a degree of supercooling (a difference between the saturation temperature and the film forming temperature) is less than about 30° C. nuclei did not occur in the melt before and after the film forming process and the melt was in a supercooled state as uniform liquid phase. However, when the degree of supercooling is more than about 30° C., the nuclei occurred and the solid phase came out in the melt itself so that the supercooling state was not maintained. Consequently, it was difficult to produce the film.

On the contrary, the example of the invention comprises a holding stage to maintain the temperature of each melt at the holding temperature to make the solid phase and the liquid phase stably coexist, so that, if the charged composition of the melt was variously changed, it was possible to produce the film at a wide range of temperatures. The process of the invention thereby substantially distinctive from the conventional process.

Moreover, the half value width of the X-ray rocking curve of the film of each example having each charged composition shown in the Table 1 and 2 is conspicuously improved compared with that of the film of each example having the corresponding charged composition shown in the Table 3. As a matter of course, it was difficult to cause the epitaxial growth itself at a temperature lower than 600° C. and it was impossible to produce the film at a temperature higher than the saturation temperature decided by each charged composition.

In particular, when the charged composition of the melt was a composition comprising 10 mol %/90 mol % to 50 mol %/50mol % of solute/the melting medium and the film forming temperature was 950° C. to 700° C. the half value width of each single crystal film was made smaller than that of the single crystal substrate.

In the examples of the invention, it was rather difficult to produce the film when the degree of supercooling ΔT was higher than 20° C., because in this case, nuclei rapidly occur in the liquid phase in the melt to make it difficult to maintain the liquid phase as stable and uniform supercooling state.

EXPERIMENT 2

In a LiNbO$_3$-LiVO$_3$ pseudo-binary system, a charged composition of a melt was set at a composition of 10 mol % of LiNbO$_3$ and 90 mol % of LiVO$_3$. The process described in the "Experiment 1" was effected using the melt. A half-value width of an X-ray rocking curve of each substrate of lithium niobate single crystal used was 6.8 to 6.9 (arc sec). Degrees of supercooling (differences between film forming temperatures and the holding temperatures at which the solid phase and liquid phase coexist) were variously changed as shown in Table 4. Table 4 shows a relationship of the half value width of the X-ray rocking curve of the lithium niobate single crystal film produced by the process and the degree of supercooling ΔT. In the Table 4, "X" means that the film was not able to be produced.

TABLE 4

| A film-forming temperature °C. | A charged composition of each melt 10 mol % LiNbO$_3$—90 mol % LiVO$_3$ | | | | | |
|---|---|---|---|---|---|---|
| | a degree of supercooling ΔT [°C.] | | | | | |
| | 5 | 10 | 15 | 20 | 25 | 30 |
| 700 | 5.8 | 5.9 | 6.4 | 6.8 | 10.0 | X |
| 750 | 5.7 | 5.7 | 6.5 | 6.9 | 11.4 | X |
| 800 | 5.8 | 5.8 | 6.7 | 6.9 | 15.2 | X |

As can be seen from the Table 4, it was possible to produce the film having excellent crystallinity comparable to that of the used substrate by applying the degree of supercooling not higher than 20° C. Moreover, the crystallinity of the film was considerably improved by applying the degree of supercooling not higher than 15° C. and the crystallinity was further improved by applying the degree of supercooling not higher than 10° C.

EXPERIMENT 3

In a LiNbO$_3$-LiVO$_3$ pseudo-binary system, a charged composition of a melt was set at a composition of 20 mol % of LiNbO$_3$ and 80 mol % of LiVO$_3$. The process described in the "Experiment 2" was effected using the melt. Degrees of supercooling (differences between film forming temperatures and the holding temperatures at which the solid phase and liquid phase coexist) were variously changed as shown in Table 5. Table 5 shows a relationship of the half value width of the X-ray rocking curve of the lithium niobate single crystal film produced by the process and the degree of supercooling ΔT.

TABLE 5

A charged composition of each melt
20 mol % LiNbO$_3$—80 mol % LiVO$_3$

| A film-forming temperature °C. | a degree of supercooling ΔT [°C.] | | | | | |
|---|---|---|---|---|---|---|
| | 5 | 10 | 15 | 20 | 25 | 30 |
| 800 | 5.7 | 5.7 | 5.9 | 6.1 | 13.5 | X |
| 850 | 5.6 | 5.6 | 5.8 | 6.0 | 16.2 | X |
| 900 | 5.6 | 5.6 | 5.9 | 6.2 | 18.9 | X |

As can be seen from the Table 4, it was possible to produce the film having excellent crystallinity comparable to that of the used substrate by applying the degree of supercooling not higher than 20° C. Moreover, the crystallinity of the film was considerably improved by applying the degree of supercooling not higher than 15° C., and the crystallinity was further improved by applying the degree of supercooling not higher than 10° C.

EXPERIMENT 4

In a LiNbO$_3$-LiVO$_3$ pseudo-binary system, a charged composition of a melt was set at a composition of 30 mol % of LiNbO$_3$ and 70 mol % of LiVO$_3$. The process described in the "Experiment 2" was effected using the melt. Degrees of supercooling (differences between film forming temperatures and the holding temperatures at which the solid phase and liquid phase coexist) were variously changed as shown in Table 6. Table 6 shows a relationship of the half value width of the X-ray rocking curve of the lithium niobate single crystal film produced by the process and the degree of supercooling ΔT.

TABLE 6

A charged composition of each melt
30 mol % LiNbO$_3$—70 mol % LiVO$_3$

| A film-forming temperature °C. | a degree of supercooling ΔT [°C.] | | | | | |
|---|---|---|---|---|---|---|
| | 5 | 10 | 15 | 20 | 25 | 30 |
| 800 | 5.6 | 5.7 | 5.7 | 6.2 | 19.2 | X |
| 850 | 5.7 | 5.7 | 5.7 | 6.1 | 20.6 | X |
| 900 | 5.6 | 5.6 | 5.9 | 6.0 | 20.8 | X |

As can be seen from the Table 6, it was possible to produce the film having excellent crystallinity comparable to that of the used substrate by applying the degree of supercooling not higher than 20° C. Moreover, the crystallinity of the film was considerably improved by applying the degree of supercooling not higher than 15° C., and the crystallinity was further improved by applying the degree of supercooling not higher than 10° C.

EXPERIMENT 5

In a LiNbO$_3$-LiBO$_2$ pseudo-binary system, a charged composition of a melt was set at a composition selected from 10 mol % of LiNbO$_3$ and 90 mol % of LiBO$_2$ to 60 mol % of LiNbO$_3$ and 40 mol % of LiBO$_2$. The process according to the invention was effected along the temperature schedule in FIG. 3. A ratio of LiNbO$_3$ in each melt was shown in Table 7. Each melt 2 was stirred at a sufficiently high temperature T$_1$ (1000° C.–1300° C.) for not less than 3 hours to attain a sufficiently uniform liquid state.

Thereafter, after the melt was cooled to the holding temperature T$_2$, the melt was held at this temperature for not less than 12 hours until nuclei of lithium niobate corresponding to an oversaturated amount were formed and the solid phase 5 precipitated. The liquid phase 4 in the melt was in the saturated state at the temperature T$_2$, and the liquid phase 4 and the solid phase 5 of lithium niobate coexisted in the melt 3. Then, the melt 3 was cooled from T$_2$ to the film-forming temperature T$_3$ lower than T$_2$ by a degree of supercooling ΔT. Immediately after that, a substrate 6 of lithium niobate single crystal was contacted with the melt to produce a film.

Table 7 shows a relationship of half value widths of X-ray rocking curves of the lithium niobate single crystal films, the film forming temperatures and the charged compositions of the melts, when the degree of supercooling ΔT (T$_2$–T$_3$)=5° C. In the Table 7, "x" means that the film was not able to be produced.

TABLE 7

A degree of supercooling ΔT = 5° C.
A charged composition of each melt
x mol % LiNbO$_3$—(100 − x) mol % LiBO$_2$

| A film-forming temperature °C. | x | | | | | |
|---|---|---|---|---|---|---|
| | 10 | 20 | 30 | 40 | 50 | 60 |
| 600 | X | X | X | X | X | X |
| 650 | 7.8 | 7.7 | 7.8 | 7.8 | 9.9 | 14.9 |
| 700 | 5.9 | 5.9 | 5.9 | 5.9 | 6.1 | 15.1 |
| 750 | 5.8 | 5.7 | 5.7 | 5.7 | 5.9 | 8.2 |
| 800 | 5.9 | 5.6 | 5.6 | 5.8 | 6.0 | 8.0 |
| 850 | 6.8 | 5.6 | 5.6 | 5.8 | 6.0 | 8.1 |
| 900 | X | 5.6 | 5.7 | 5.8 | 5.9 | 8.3 |
| 950 | X | 6.7 | 6.8 | 6.6 | 6.7 | 8.4 |
| 1000 | X | X | 8.1 | 8.2 | 8.1 | 8.9 |
| 1050 | X | X | X | 11.2 | 12.0 | 13.8 |
| 1100 | X | X | X | X | 16.5 | 18.3 |
| 1150 | X | X | X | X | X | X |

As can be seen from the Table 7, according to the process of the invention, if the charged composition of the melt was variously changed, it was possible to produce the film at a wide range of temperatures, because the inventive process comprises a holding stage to maintain the temperature of each melt at the holding temperature to make the solid phase and the liquid phase stably coexist in the melt.

In particular, when the charged composition of the melt was a composition comprising 10 mol %/90 mol % to 50 mol %/50 mol % of solute/melting medium and the film forming temperature was 950° C. to 700° C., the half value width of each single crystal film was made smaller than that of the single crystal substrate.

In the examples of the invention, it was rather difficult to produce the film when the degree of supercooling ΔT was higher than 20° C., because in this case, nuclei rapidly occur in the liquid phase in the melt to make it difficult to maintain the liquid phase as stable and uniform supercooling state.

EXPERIMENT 6

In the experiment 1, a charged composition of a melt was set at a composition of 20 mol % of LiNbO$_3$ and 80 mol % of LiVO$_3$, a film forming temperature was set at 900° C. and thicknesses of the films were variously changed. The process described in the experiment 1 was carried out to produce each film and a relationship between the thickness of the film and the crystallinity thereof, that is, half value width of its X-ray rocking curve was investigated. The thicknesses and the half value widths of the films produced according to the above process is shown in Table 8.

TABLE 8

| a thickness of each film (µm) | a half value width (arc sec) |
|---|---|
| 1 | 20.4 |
| 3 | 14.1 |
| 5 | 6.6 |
| 7 | 5.8 |
| 10 | 5.6 |
| 13 | 5.6 |
| 16 | 5.7 |
| 20 | 5.6 |
| 25 | 5.7 |
| 35 | 5.6 |
| 50 | 5.6 |

As can be seen from the Table 8, the present inventors found that the larger the thickness of the film, the smaller the half-value width and that the half value width of the single crystal film was made smaller than that of the single crystal substrate by producing the film having a thickness not less than 5 µm. The reason was assumed as follows. The used substrates made of lithium niobate single crystal were produced by the pull up process and comprise a congruent composition. On the contrary, the films made of lithium niobate single crystal produced according to the inventive process comprise compositions near a stoichiometric composition. Consequently, lattice constants of the films and the substrates were different and misadjustment of the lattice constants (lattice mismatch) occurs. Such misadjustment or mismatch provides a residual stress between each film and the substrate after producing the film. The crystallinity of the film may be influenced adversely by the residual stress.

Moreover, when the thickness of the single crystal film is not more than 5 µm, the crystallinity of the film may considerably be influenced by the residual stress. However, when the thickness of the single crystal film is more than 5 µm, such adverse effect caused by the mismatching of the lattice constants seems to be limited, and it is possible to produce the film of lithium niobate single crystal having excellent crystallinity and a composition near a stoichiometric composition.

EXPERIMENT 7

Further, the inventors selected the single crystal films having the different half value widths from the films produced in the above experiment 1, produced an optical waveguide in each of the selected films by applying a titan in-diffusion method and evaluated the optical damage resistivity of each optical waveguide, respectively. Light of a wavelength 830 nm was applied. As a result, when the half value width of the film was 6.9 which was comparable with that of the used substrate, optical damage occurred in the optical waveguide by transmitting light having a power of 0.2 mW. On the contrary, when the half value width of the film was 5.6, optical damage did not occur in the waveguide by transmitting light having a power of 1 mW.

EXPERIMENT 8

In a $LiNbO_3$-$LiTaO_3$-$LiVO_3$ pseudo-ternary system, the process described in the experiment 1 according to the invention was effected along the temperature schedule in FIG. 3 and under the conditions shown in Table 9.

Each melt 2 was stirred at a sufficiently high temperature $T_1$ (1000° C.–1300° C.) for not less than 3 hours to attain a sufficiently uniform liquid state. Thereafter, after the melt was cooled to the holding temperature $T_2$, the melt was held at this temperature for not less than 12 hours until nuclei of lithium niobate corresponding to an oversaturated amount were formed and the solid phase 5 precipitated. The liquid phase 4 in the melt was in the saturated state at the temperature $T_2$, and the liquid phase 4 and the solid phase 5 of lithium niobate coexisted in the melt 3. The holding temperature $T_2$ and the composition of the liquid phase 4 were changed as shown in FIG. 9.

Then, the melt 3 was cooled from $T_2$ to the film-forming temperature $T_3$ lower than $T_2$ by a degree of supercooling $\Delta T$. Immediately after that, a substrate 6 of lithium niobate single crystal was contacted with the melt to produce a film. The degrees of supercooling $\Delta T$ were changed as shown in FIG. 9.

The thus produced films comprised a composition of $LiNb_{1-x}Ta_xO_3$. The composition of each solid solution film was measured and the values of x were shown in Table 9. Moreover, the half value width of X-ray rocking curve of each solid solution film was measured and shown in the Table 9.

TABLE 9

| a holding temperature $T_2$ (°C.) | a composition of the liquid phase of each melt | a degree of supercooling $\Delta T$ (°C.) | a composition of each film x | a half value width (sec) |
|---|---|---|---|---|
| 900 | 90:9:1 | 15 | 0.16 | 6.4 |
| 950 | 93:4:3 | 15 | 0.41 | 5.7 |
| 950 | 88:10:2 | 5 | 0.22 | 5.6 |
| 950 | 83:16:1 | 3 | 0.10 | 5.6 |
| 1000 | 93:3:4 | 42 | 0.68 | 5.7 |
| 1000 | 90:6:4 | 13 | 0.36 | 5.7 |
| 1000 | 80:18:2 | 5 | 0.12 | 5.8 |
| 1000 | 80:18:2 | 15 | 0.17 | 5.6 |
| 1050 | 88:6:6 | 23 | 0.76 | 5.6 |
| 1050 | 80:16:4 | 6 | 0.27 | 5.7 |
| 1070 | 70:27:3 | 15 | 0.15 | 5.6 |
| 1100 | 83:10:7 | 47 | 0.78 | 5.8 |
| 1100 | 65:31:4 | 7 | 0.09 | 5.6 |
| 1100 | 65:31:4 | 15 | 0.18 | 5.6 |
| 1120 | 60:36:4 | 15 | 0.16 | 6.3 |
| 1150 | 77:14:9 | 30 | 0.65 | 5.9 |
| 1150 | 65:28:7 | 16 | 0.29 | 5.9 |
| 1200 | 73:16:11 | 40 | 0.76 | 7.4 |
| 1200 | 65:25:10 | 30 | 0.46 | 7.3 |
| 1230 | 70:18:12 | 35 | 0.50 | 18.6 |
| 1230 | 62:27:11 | 28 | 0.41 | 20.1 |

As can be seen from the Table 9, the holding temperature was variously changed and each film was produced as shown in the Table 9. When the holding temperature $T_2$ is not higher than 1200° C., it is possible to produce the solid solution films each having a low half value width and therefore excellent crystallinity. In particular, when applying the compositions having saturation temperatures not higher than 1150° C. it is possible to produce the solid solution films each having a half value width of X-ray rocking curve lower than that of the used substrate, that is, excellent crystallinity superior than that of the substrate.

On the contrary, when the saturation temperature reaches 1230° C., that is, not lower than 1200° C., the half value width of the solid solution film is considerably degraded.

Moreover, as can be seen from the Table 9, by applying the temperature schedule shown in FIG. 3 and thus a holding stage to maintain the temperature of each melt at the holding temperature to make the solid phase and the liquid phase stably coexist, so that, if the charged composition of the melt is variously changed, it is possible to produce the film at a wide range of temperatures. Moreover, the half value width of the film of each example having each charged composition shown in the Table 9 is conspicuously improved.

As explained above, the present invention relates to an optoelectric article in which a film of optoelectric single crystal is formed on a substrate of optoelectric single crystal by a liquid phase epitaxial process, and the invention make it possible to improve an optical damage resistivity of an optical waveguide to a value sufficiently high for use as optoelectric devices, when the optical waveguide is formed in the film. Consequently, the invention successfully provides an optoelectric article useful as a material for various optoelectric devices such as an optical waveguide substrate, an SHG device etc.

The present invention also provides a novel process to produce the film having excellent crystallinity, especially having better crystallinity than that of the substrate, with high reproducibility, when the film is formed on the substrate by the liquid phase epitaxial process.

What is claimed is:

1. An optoelectric article comprising:
   a substrate comprised of an optoelectric single crystal; and
   an optoelectric single crystal film formed on said substrate by a liquid phrase epitaxial process, wherein a half value width of an X-ray rocking curve of said film is not more than that of said substrate.

2. The optoelectric article as claimed in claim 1, wherein said half value width of said film is smaller than that of said substrate.

3. The optoelectric article as claimed in claim 1, wherein a thickness of said film is not less than 5 µm.

4. The optoelectric article as claimed in claim 1, wherein said optoelectric single crystal film comprises a material selected from the group consisting of a single crystal of lithium niobate ($LiNbO_3$), a single crystal of lithium tantalate ($LiTaO_3$) and a single crystal of $LiNb_xTa_{1-x}O_3$ ($0<x<1$).

5. A process for producing an optoelectric article comprising a substrate comprised of an optoelectric single crystal and an optoelectric single crystal film formed on said substrate by a liquid phase epitaxial process, said process comprising the steps of:
   producing a melt of a solute and a melting medium, a solid phase and a liquid phase coexisting in said melt;
   then cooling said liquid phase for producing a supercooled state in said liquid phase; and
   contacting said substrate to said liquid phase to form said film on said substrate by an epitaxial growing process.

6. The process for producing said optoelectric article as claimed in claim 5, wherein said melt is cooled to a temperature lower than a saturation temperature of said melt to precipitate said solid phase in said melt.

7. The process for producing said optoelectric article as claimed in claim 6, wherein said melt is heated to a temperature higher than said saturation temperature to produce uniformly molten liquid phase, which is then cooled to a temperature lower than said saturation temperature to precipitate said solid phase in said melt.

8. The process for producing said optoelectric article as claimed in claim 5, wherein said melt is heated to a temperature higher than a saturation temperature of said melt to produce uniformly molten liquid phase, which is then cooled to a temperature higher than said saturation temperature, and a predetermined amount of said solute is added to said melt so as to produce a melt in which a solid phase and a liquid phase stably coexist.

9. The process for producing said optoelectric article as claimed in claim 5, wherein said solute is selected from a group consisting of lithium niobate ($LiNbO_3$), lithium tantalate ($LiTaO_3$) and $LiNb_xTa_{1-x}O_3$ ($0<x<1$).

10. The process for producing said optoelectric article as claimed in claim 9, wherein said melting medium is selected from a group consisting of $LiVO_3$ and $LiBO_2$.

11. The process for producing said optoelectric article as claimed in claim 9, wherein a charged composition of said melt is a composition comprising 10 mol % to 60 mol % of said solute and 90 mol % to 40 mol % of said melting medium.

12. The process for producing said optoelectric article as claimed in claim 11, wherein said charged composition is a composition comprising 10 mol % to 50 mol % of said solute and 90 mol % to 50 mol % of said melting medium and a temperature at which said film is formed is 950° C. to 700° C.

13. The process for producing said optoelectric article as claimed in claim 5, wherein a degree of supercooling, which is a difference between a holding temperature at which said liquid phase and said solid phase coexist in said melt and a growing temperature at which said liquid phase is supercooled, is not more than 50° C.

14. The process for producing said optoelectric article as claimed in claim 13, wherein said degree of supercooling is not more than 20° C.

* * * * *